(12) United States Patent
    Tashiro et al.

(10) Patent No.: US 11,464,122 B2
(45) Date of Patent: Oct. 4, 2022

(54) LOCK STRUCTURE, ELECTRICAL CONNECTION BOX, AND WIRE HARNESS

(71) Applicant: Yazaki Corporation, Tokyo (JP)

(72) Inventors: Hiroki Tashiro, Shizuoka (JP); Masahiro Wada, Shizuoka (JP); Ryouichi Yokoyama, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 624 days.

(21) Appl. No.: 16/540,350

(22) Filed: Aug. 14, 2019

(65) Prior Publication Data

US 2020/0068732 A1    Feb. 27, 2020

(30) Foreign Application Priority Data

Aug. 21, 2018 (JP) .............................. JP2018-154901

(51) Int. Cl.
*H05K 5/02* (2006.01)
*B60R 16/02* (2006.01)
(Continued)

(52) U.S. Cl.
CPC ....... *H05K 5/0221* (2013.01); *B60R 16/0207* (2013.01); *H02G 3/14* (2013.01); (Continued)

(58) Field of Classification Search
CPC .. H05K 5/0221; H05K 5/0226; H05K 5/0217; H05K 7/026; H02G 3/08;
(Continued)

(56) References Cited

U.S. PATENT DOCUMENTS

| | | | |
|---|---|---|---|
| 9,935,436 B1* | 4/2018 | Baldwin | ................... H02G 3/14 |
| 2008/0164793 A1* | 7/2008 | Ozawa | ............... H01R 13/6271 |
| | | | 312/270.2 |

(Continued)

FOREIGN PATENT DOCUMENTS

| | | |
|---|---|---|
| CN | 104508928 A | 4/2015 |
| CN | 104659721 A | 5/2015 |

(Continued)

*Primary Examiner* — Hoa C Nguyen
*Assistant Examiner* — Amol H Patel
(74) *Attorney, Agent, or Firm* — Sughrue Mion, PLLC

(57) ABSTRACT

A first engagement body is provided to one of two assembly members to be assembled with each other through a relative rotation operation pivoted about a relative rotational axis, and a second engagement body is provided to the other assembly member. The first engagement body includes a first and a second spaces, the first space being provided to allow rotation of a third opposing wall part of the second engagement body relative to the first engagement body, which is pivoted about the relative rotational axis until engagement between the first engagement member and a second engagement member of the second engagement body is completed, the second space being provided to allow rotation of a fourth opposing wall part of the second engagement body relative to the first engagement body, which is pivoted about the relative rotational axis until engagement of the first and the second engagement members is completed.

11 Claims, 15 Drawing Sheets

(51) Int. Cl.
  *H02G 3/16* (2006.01)
  *H02G 3/14* (2006.01)
  *B60R 16/023* (2006.01)
  *H05K 5/03* (2006.01)
  *H05K 7/02* (2006.01)

(52) U.S. Cl.
  CPC ............ *H02G 3/16* (2013.01); *H05K 5/03* (2013.01); *H05K 7/026* (2013.01)

(58) Field of Classification Search
  CPC ...... H02G 3/086; H02G 3/14; B60R 16/0238; B60R 16/0239
  See application file for complete search history.

(56) References Cited

U.S. PATENT DOCUMENTS

| | | | |
|---|---|---|---|
| 2012/0048590 A1* | 3/2012 | Drane | H02G 3/14 174/67 |
| 2015/0171608 A1 | 6/2015 | Ueyama | |
| 2016/0315459 A1* | 10/2016 | Nakashima | H05K 5/0247 |

FOREIGN PATENT DOCUMENTS

| | | | |
|---|---|---|---|
| JP | 2011-125173 A | | 6/2011 |
| JP | 2011244647 A | * | 12/2011 |
| JP | 2011244647 A | | 12/2011 |

\* cited by examiner

LOCK STRUCTURE, ELECTRICAL CONNECTION BOX, AND WIRE HARNESS

CROSS-REFERENCE TO RELATED APPLICATION(S)

The present application claims priority to and incorporates by reference the entire contents of Japanese Patent Application No. 2018-154901 filed in Japan on Aug. 21, 2018.

BACKGROUND OF THE INVENTION

1. Field of the Invention

The present invention relates to a lock structure, an electrical connection box, and a wire harness.

2. Description of the Related Art

Conventionally, a lock structure for maintaining assembly of two target assembly members has been known. The lock structure includes a first engagement body provided to one of the two assembly members, and a second engagement body provided to the other assembly member. The lock structure holds assembly of the two assembly members through engagement between an engagement member of the first engagement body and an engagement member of the second engagement body when the assembly of the two assembly members is completed. For example, the lock structure is applied to an electrical connection box housing an electronic component, and an electrical connection box housing an electronic component and an electric wire and forming a wire harness together with the electric wire extended to outside (Japanese Patent Application Laid-open No. 2011-125173). In an electrical connection box, two engagement members, opening peripheral parts of which are fitted to each other are provided as components of a housing, and the lock structure is used to maintain engagement between the two engagement members as assembly members.

SUMMARY OF THE INVENTION

The lock structure is disposed between the two assembly members at a position suitable for maintaining assembly of the assembly members. The present invention is intended to provide a lock structure in which the first engagement body and the second engagement body can perform an engagement operation adaptive for a relative assembly operation between the two assembly members at the suitable position so that engagement between the engagement members is completed. The present invention is also intended to provide an electrical connection box and a wire harness that include the lock structure.

In order to achieve the above mentioned object, a lock structure according to one aspect of the present invention includes a first engagement body that includes a first engagement member and first and second opposing wall parts extending in a same direction and disposed opposite to each other with the first engagement member interposed between the first and the second opposing wall parts and is disposed, in one of two assembly members to be assembled with each other through a relative rotation operation pivoted about a relative rotational axis, at a position separated from the relative rotational axis in a direction orthogonal to an axis line direction of the relative rotational axis so that a direction orthogonal to a direction in which the first and the second opposing wall parts are disposed opposite to each other and a direction in which the first and the second opposing wall parts extend is aligned with the axis line direction of the relative rotational axis; and a second engagement body that includes a second engagement member engaged with the first engagement member when the assembly of the two assembly members is completed and third and fourth opposing wall parts extending in a same direction and disposed opposite to each other with the second engagement member interposed between the third and the fourth opposing wall parts and is disposed, in the other of the two assembly members, at a position separated from the relative rotational axis in the direction orthogonal to the axis line direction of the relative rotational axis so that a direction orthogonal to a direction in which the third and the fourth opposing wall parts are disposed opposite to each other and a direction in which the third and the fourth opposing wall parts extend is aligned with the axis line direction of the relative rotational axis, wherein the first engagement body includes a first space and a second space, the first space being provided between the first engagement member and the first opposing wall part on the relative rotational axis side to allow rotation of the third opposing wall part on the relative rotational axis side relative to the first engagement body, which is pivoted about the relative rotational axis until engagement between the first and the second engagement members is completed, the second space being provided between the first engagement member and the second opposing wall part to allow rotation of the fourth opposing wall part relative to the first engagement body, which is pivoted about the relative rotational axis until engagement between the first and the second engagement members is completed.

According to another aspect of the present invention, in the lock structure, it is possible to configure that in the first engagement body, with reference to a position of the first engagement member relative to the one of the two assembly members, an interval from the first opposing wall part to the first engagement member in the direction in which the first and the second opposing wall parts are disposed opposite to each other is increased to form the first space, and an interval from the second opposing wall part to the first engagement member in the direction in which the first and the second opposing wall parts are disposed opposite to each other is increased to form the second space.

According to still another aspect of the present invention, in the lock structure, it is possible to configure that the first and the second engagement members are formed in claw shapes engageable with each other, and the second engagement body includes a third space provided between the third and the fourth opposing wall parts to allow rotation of the first engagement member relative to the second engagement body, which is pivoted about the relative rotational axis until engagement between the first and the second engagement members is completed.

According to still another aspect of the present invention, in the lock structure, it is possible to configure that in the second engagement body, with reference to a position of the second engagement member relative to the other of the two assembly members, an interval from the third opposing wall part to the second engagement member in the direction in which the third and the fourth opposing wall parts are disposed opposite to each other is increased to form the third space.

In order to achieve the above mentioned object, an electrical connection box according to another aspect of the present invention includes a housing that houses an electronic component inside, wherein the housing includes two assembly members to be assembled with each other through a relative rotation operation pivoted about a relative rotational axis, and a lock structure holding the two assembly members being assembled with each other, the lock structure includes a first engagement body that includes a first engagement member and first and second opposing wall parts extending in a same direction and disposed opposite to each other with the first engagement member interposed between the first and the second opposing wall parts and is disposed, in one of the two assembly members, at a position separated from the relative rotational axis in a direction orthogonal to an axis line direction of the relative rotational axis so that a direction orthogonal to a direction in which the first and the second opposing wall parts are disposed opposite to each other and a direction in which the first and the second opposing wall parts extend is aligned with the axis line direction of the relative rotational axis, and a second engagement body that includes a second engagement member engaged with the first engagement member when the assembly of the two assembly members is completed and third and fourth opposing wall parts extending in a same direction and disposed opposite to each other with the second engagement member interposed between the third and the fourth opposing wall parts and that is disposed, in the other of the two assembly members, at a position separated from the relative rotational axis in the direction orthogonal to the axis line direction of the relative rotational axis so that a direction orthogonal to a direction in which the third and the fourth opposing wall parts are disposed opposite to each other and a direction in which the third and the fourth opposing wall parts extend is aligned with the axis line direction of the relative rotational axis, and the first engagement body includes a first space and a second space, the first space being provided between the first opposing wall part on the relative rotational axis side and the first engagement member to allow rotation of the third opposing wall part on the relative rotational axis side relative to the first engagement body, which is pivoted about the relative rotational axis until engagement between the first and the second engagement members is completed, the second space being provided between the second opposing wall part and the first engagement member to allow rotation of the fourth opposing wall part relative to the first engagement body, which is pivoted about the relative rotational axis until engagement between the first and the second engagement members is completed.

In order to achieve the above mentioned object, a wire harness according to still another aspect of the present invention includes an electronic component; an electric wire electrically connected with the electronic component; and a housing that houses inside the electronic component and the electric wire, the electric wire being extended from inside to outside, wherein the housing includes two assembly members to be assembled with each other through a relative rotation operation pivoted about a relative rotational axis, and a lock structure holding the two assembly members being assembled with each other, the lock structure includes a first engagement body that includes a first engagement member and first and second opposing wall parts extending in a same direction and disposed opposite to each other with the first engagement member interposed the first and the second opposing wall parts and is disposed, in one of the two assembly members, at a position separated from the relative rotational axis in a direction orthogonal to an axis line direction of the relative rotational axis so that a direction orthogonal to a direction in which the first and the second opposing wall parts are disposed opposite to each other and a direction in which the first and the second opposing wall parts extend is aligned with the axis line direction of the relative rotational axis, and a second engagement body that includes a second engagement member engaged with the first engagement member when the assembly of the two assembly members is completed and third and fourth opposing wall parts extending in a same direction and disposed opposite to each other with the second engagement member interposed the third and the fourth opposing wall parts and is disposed, in the other of the two assembly members, at a position separated from the relative rotational axis in the direction orthogonal to the axis line direction of the relative rotational axis so that a direction orthogonal to a direction in which the third and the fourth opposing wall parts are disposed opposite to each other and a direction in which the third and the fourth opposing wall parts extend is aligned with the axis line direction of the relative rotational axis, and the first engagement body includes a first space and a second space, the first space being provided between the first opposing wall part on the relative rotational axis side and the first engagement member to allow rotation of the third opposing wall part on the relative rotational axis side relative to the first engagement body, which is pivoted about the relative rotational axis until engagement between the first and the second engagement members is completed, the second space being provided between the second opposing wall part and the first engagement member to allow rotation of the fourth opposing wall part relative to the first engagement body, which is pivoted about the relative rotational axis until engagement between the first and the second engagement members is completed.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
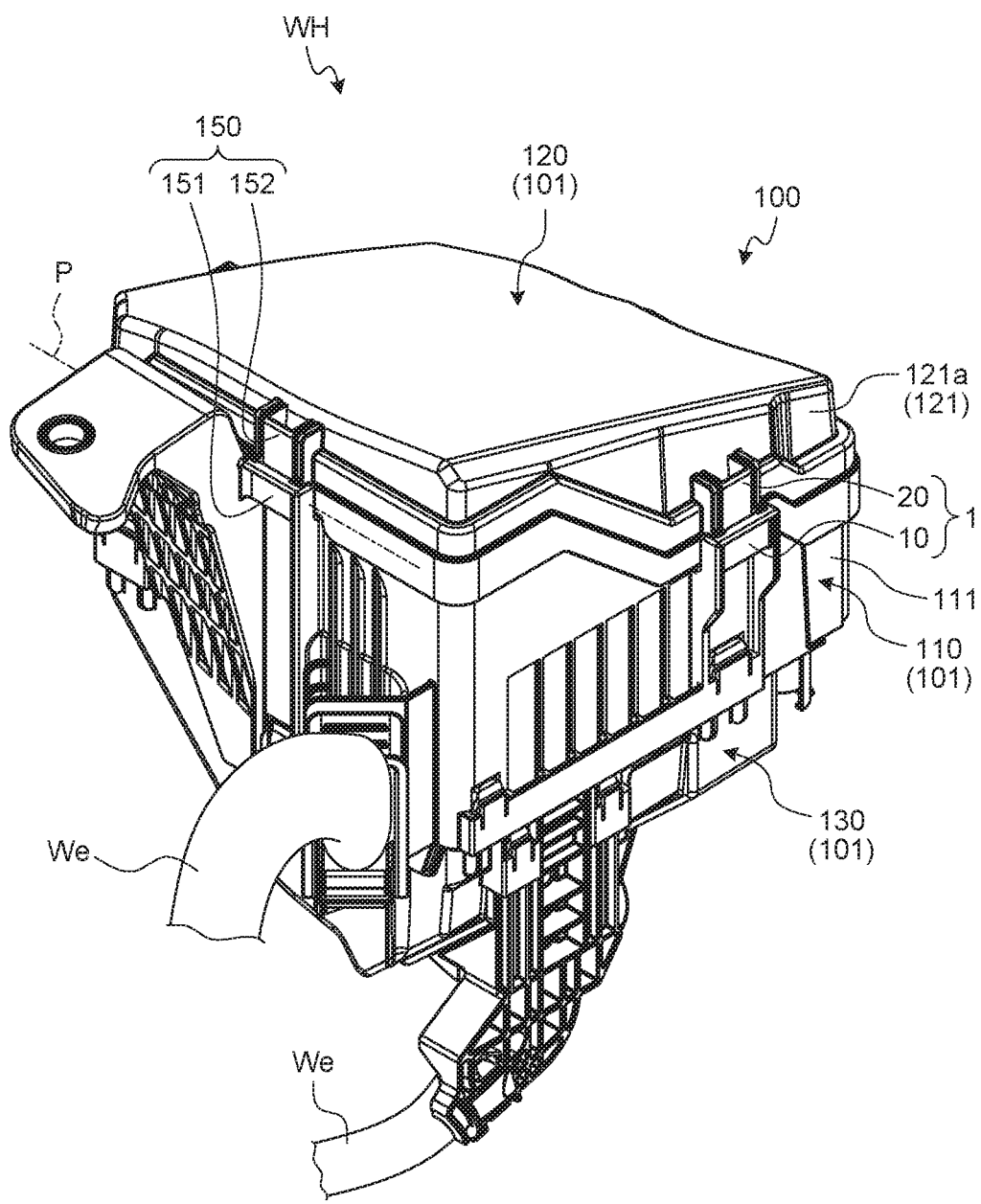
FIG. 1 is a perspective view illustrating a lock structure, an electrical connection box, and a wire harness according to an embodiment.

The following describes an embodiment of a lock structure, an electrical connection box, and a wire harness according to the present invention in detail with reference to the accompanying drawings. The present embodiment does not limit the present invention.

Embodiment

The following describes one embodiment of the lock structure, the electrical connection box, and the wire harness according to the present invention with reference to FIGS. 1 to 15.

Reference Sign 1 in FIGS. 1 to 10 denotes the lock structure according to the present embodiment. Reference Sign 100 and Reference Sign WH in FIGS. 1 and 2 denote the electrical connection box according to the present embodiment including the lock structure 1, and the wire harness according to the present embodiment including the electrical connection box 100, respectively.

The lock structure 1 is provided between two assembly members 110 and 120 (FIGS. 1, 2, and 4 to 7) to be assembled with each other through a relative rotation operation pivoted about a relative rotational axis P to hold the assembly of the two assembly members 110 and 120 (FIGS. 1 to 10). The lock structure 1 includes a first engagement body 10 provided to one of the two assembly members 110 and 120, and a second engagement body 20 provided to the other assembly member (FIGS. 1 to 10). The first engagement body 10 and the second engagement body 20 are formed to perform relative rotation pivoted about the relative rotational axis P simultaneously with the relative rotation operation of the two assembly members 110 and 120 and engage with each other when assembly of the two assembly members 110 and 120 is completed. In addition, the first engagement body 10 and the second engagement body 20 are formed to maintain the engagement when the assembly of the two assembly members 110 and 120 is completed and hold the assembly of the two assembly members 110 and 120.

The axis position of the relative rotational axis P may be unchanged during the relative rotation operation until the assembly of the two assembly members 110 and 120 is completed, or may be displaced in accordance with the relative positions of the two assembly members 110 and 120. The two assembly members 110 and 120 may be assembled only through the relative rotation operation pivoted about the relative rotational axis P or through an assembly operation different from the relative rotation operation in addition to the relative rotation operation.

The first engagement body 10 includes a first engagement member 11, and first and second opposing wall parts 12 and 13 extending in the same direction and disposed opposite to each other with the first engagement member 11 interposed therebetween (FIGS. 4, 6, 9, 10, and 11). The second engagement body 20 includes a second engagement member 21 engaged with the first engagement member 11 when the assembly of the two assembly members 110 and 120 is completed, and third and fourth opposing wall parts 22 and 23 extending in the same direction and disposed opposite to each other with the second engagement member 21 interposed therebetween (FIGS. 6, 9, 10, and 12).

For example, one of the first engagement member 11 and the second engagement member 21 may be formed as a claw member in a claw shape, and the other engagement member may be formed as a wall part in which the claw member is caught. The wall part is, for example, a peripheral wall part such as a through-hole, a groove, or a cutout that the claw member enters when the assembly of the two assembly members 110 and 120 is completed. The first engagement member 11 and the second engagement member 21 may be formed in claw shapes engageable with each other when the assembly of the two assembly members 110 and 120 is completed.

The first and the second opposing wall parts 12 and 13 may be formed as plate walls, and may be two wall parts disposed opposite to each other at both ends of a piece or the like. The third and the fourth opposing wall parts 22 and 23 may be formed as plate walls, and may be two wall parts disposed opposite to each other at both ends of a piece or the like.

Figure 3:
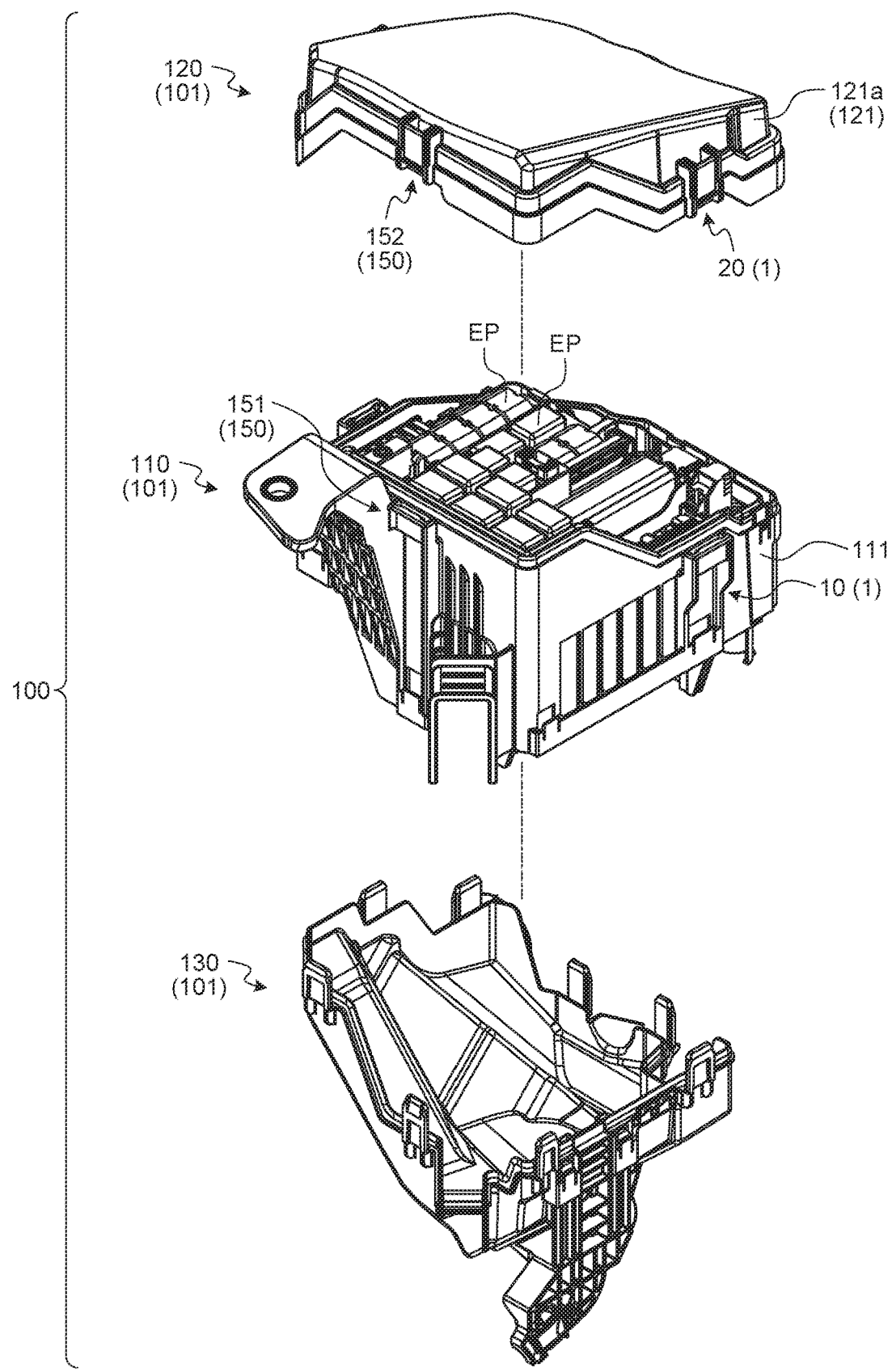
FIG. 3 is an exploded perspective view illustrating the lock structure and the electrical connection box according to the embodiment.
Figure 4:
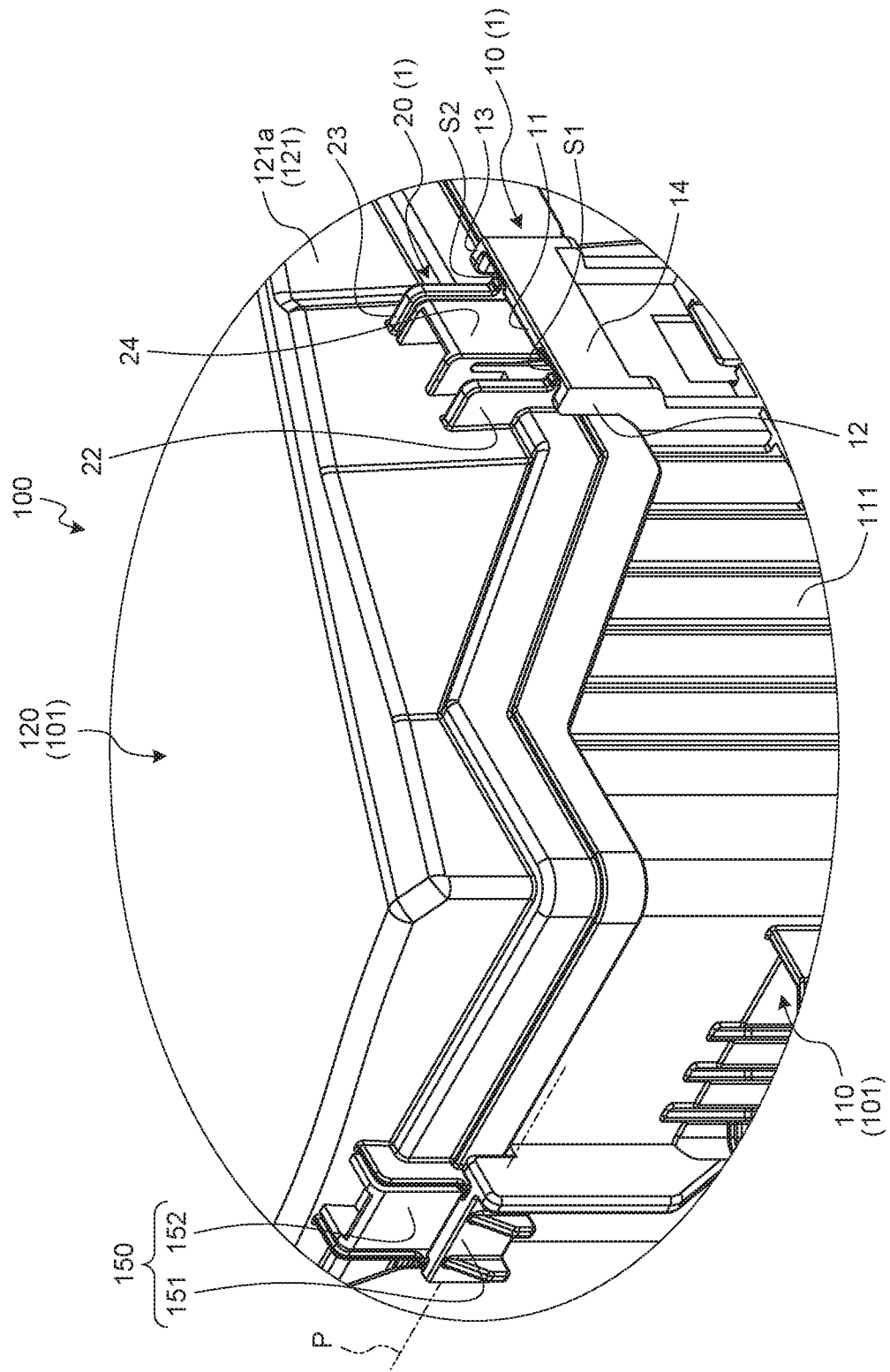
FIG. 4 is a perspective view illustrating the lock structure in an engagement-completed state.
Figure 5:
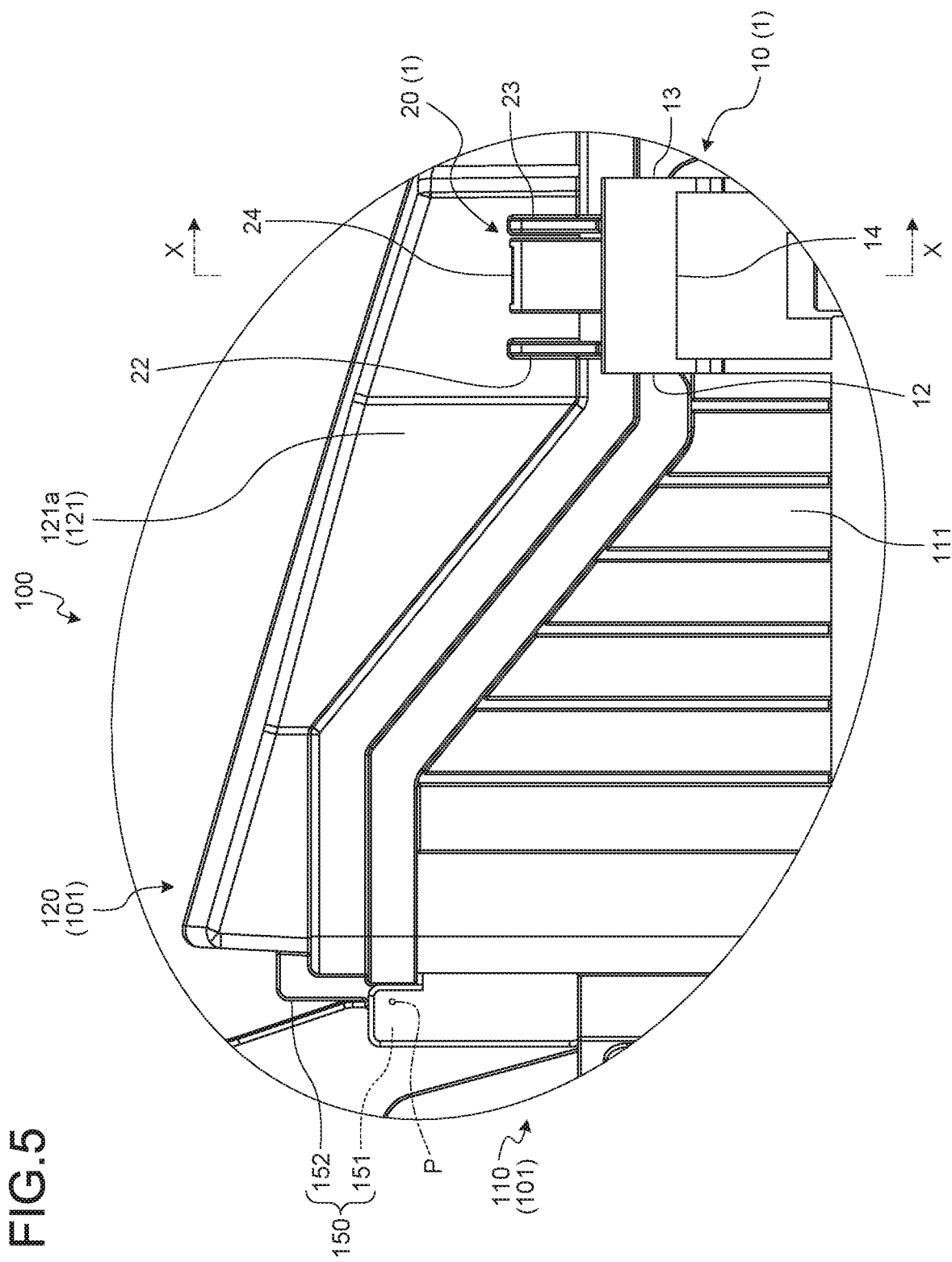
FIG. 5 is a front view illustrating the lock structure in the engagement-completed state.
Figure 6:
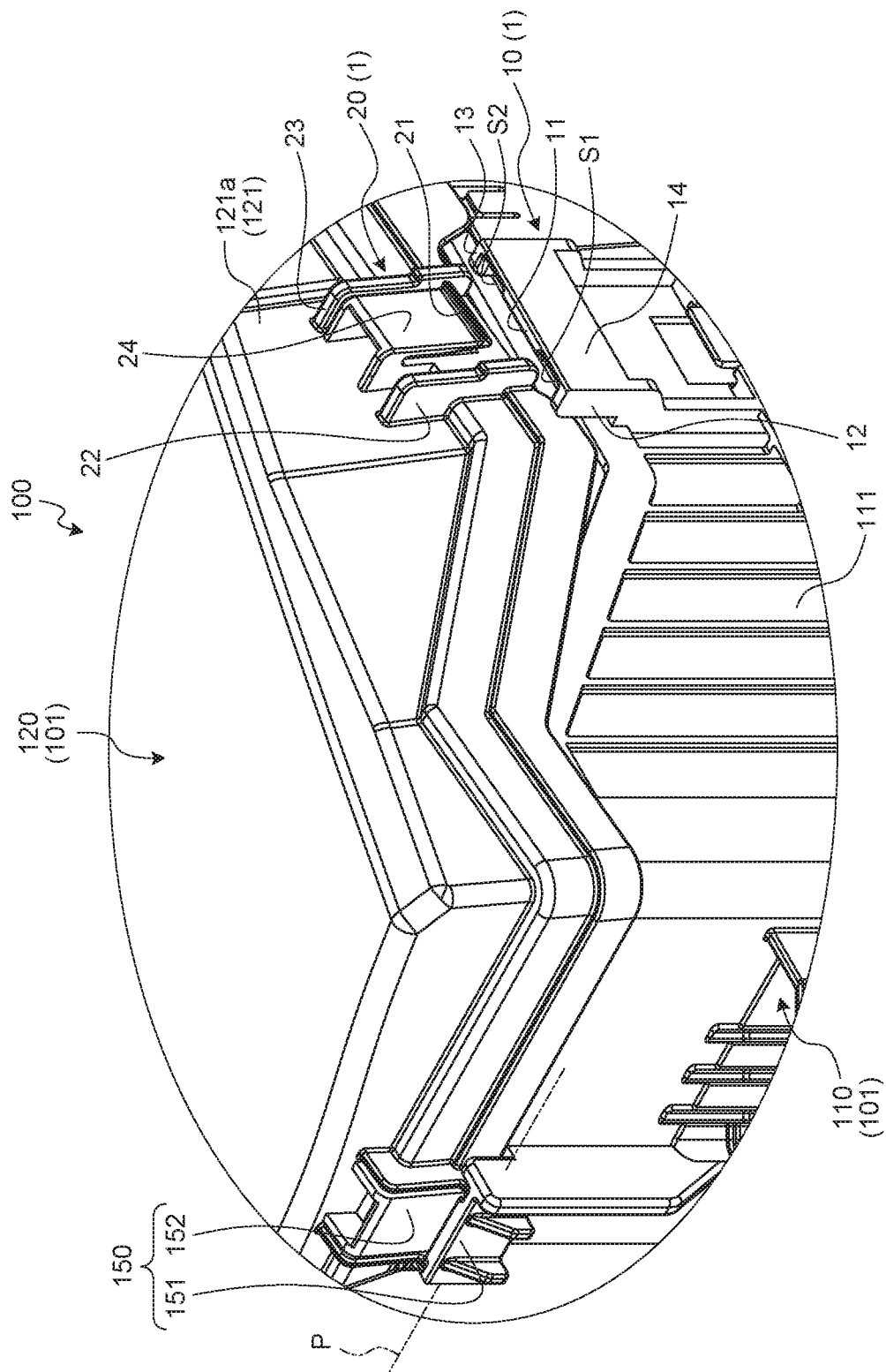
FIG. 6 is a perspective view illustrating the lock structure in an engagement operation.
Figure 7:
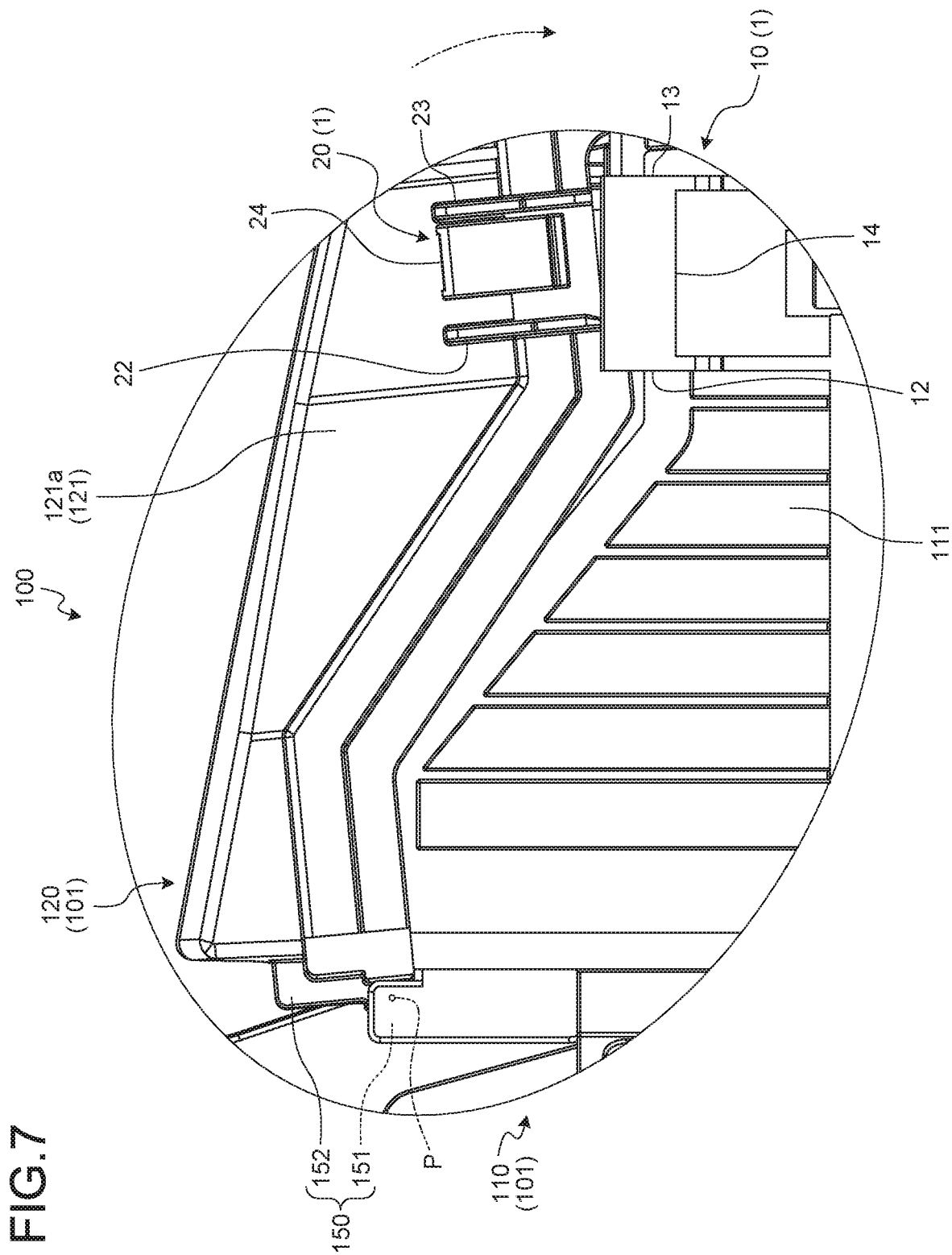
FIG. 7 is a front view illustrating the lock structure in the engagement operation.

The first engagement body 10 is disposed, in one of the two assembly members 110 and 120, at a position separated from the relative rotational axis P in a direction orthogonal to the axis line direction of the relative rotational axis P so that a direction orthogonal to the direction in which the first and the second opposing wall parts 12 and 13 are disposed opposite to each other and the direction in which the first and the second opposing wall parts 12 and 13 extend is aligned with the axis line direction of the relative rotational axis P (FIGS. 3 to 5). In the first engagement body 10, the first opposing wall part 12 is disposed on the relative rotational axis P side, and the second opposing wall part 13 is disposed at a position separated further from the relative rotational axis P than the first opposing wall part 12. The second engagement body 20 is disposed, in the other of the two assembly members 110 and 120, at a position separated from the relative rotational axis P in the direction orthogonal to the axis line direction of the relative rotational axis P so that a direction orthogonal to the direction in which the third and the fourth opposing wall parts 22 and 23 are disposed opposite to each other and the direction in which the third and the fourth opposing wall parts 22 and 23 extend is aligned with the axis line direction of the relative rotational axis P (FIGS. 3 to 5). In the second engagement body 20, the third opposing wall part 22 is disposed on the relative rotational axis P side, and the fourth opposing wall part 23 is disposed at a position separated further from the relative rotational axis P than the third opposing wall part 22.

The first engagement body 10 and the second engagement body 20 are formed to be capable of performing the relative rotation pivoted about the relative rotational axis P until the first engagement member 11 and the second engagement member 21 are engaged. In other words, the first engagement body 10 and the second engagement body 20 are formed not to engage with each other halfway through the relative rotation pivoted about the relative rotational axis P. For this purpose, the first engagement body 10 includes a first space S1 provided between the first engagement member 11 and the first opposing wall part 12, and a second space S2 provided between the first engagement member 11 and the second opposing wall part 13 (FIGS. 4, 9, 10, and 11).

The first space S1 allows rotation of the third opposing wall part 22 relative to the first engagement body 10, which is pivoted about the relative rotational axis P until the engagement between the first engagement member 11 and the second engagement member 21 is completed (in other words, until the first engagement member 11 and the second engagement member 21 become engaged with each other). The first space S1 is formed to prevent the third opposing wall part 22 from contacting the first engagement body 10 until the engagement between the first engagement member 11 and the second engagement member 21 is completed. Alternatively, the first space S1 may be formed to allow, when the third opposing wall part 22 contacts the first engagement body 10, the rotation of the third opposing wall part 22 relative to the first engagement body 10 to continue until the engagement between the first engagement member 11 and the second engagement member 21 is completed. In this case, for example, the rotation of the third opposing wall part 22 relative to the first engagement body 10 may be allowed to continue by bending both or one of the third opposing wall part 22 and the first engagement body 10 when contact is made therebetween.

For example, in the first engagement body 10, with reference to the position of the first engagement member 11 relative to one of the two assembly members 110 and 120, the interval from the first opposing wall part 12 to the first engagement member 11 in the direction in which the first and the second opposing wall parts 12 and 13 are disposed opposite to each other may be increased to form the first space S1.

The second space S2 allows rotation of the fourth opposing wall part 23 relative to the first engagement body 10, which is pivoted about the relative rotational axis P until the engagement between the first engagement member 11 and the second engagement member 21 is completed. The second space S2 is formed to prevent the fourth opposing wall part 23 from contacting the first engagement body 10 until the engagement between the first engagement member 11 and the second engagement member 21 is completed. Alternatively, the second space S2 may be formed to allow, when the fourth opposing wall part 23 contacts the first engagement body 10, the rotation of the fourth opposing wall part 23 relative to the first engagement body 10 to continue until the engagement between the first engagement member 11 and the second engagement member 21 is completed. In this case, for example, the rotation of the fourth opposing wall part 23 relative to the first engagement body 10 may be allowed to continue by bending both or one of the fourth opposing wall part 23 and the first engagement body 10 when contact is made therebetween.

For example, in the first engagement body 10, with reference to the position of the first engagement member 11 relative to one of the two assembly members 110 and 120, the interval from the second opposing wall part 13 to the first engagement member 11 in the direction in which the first and the second opposing wall parts 12 and 13 are disposed opposite to each other may be increased to form the second space S2.

In the lock structure 1, for example, when the first engagement member 11 is formed as a wall part for catching the second engagement member 21 as the claw member, the third opposing wall part 22 on the relative rotational axis P side is unlikely to be caught in the first engagement member 11 halfway through the relative rotation. Thus, the interval from the first opposing wall part 12 to the first engagement member 11 may be set in accordance with the form of the first engagement member 11. However, in the lock structure 1, for example, when the first engagement member 11 is formed as a protrusion such as a claw member and only the first space S1 is provided to the first engagement body 10, the third opposing wall part 22 is potentially caught by the first engagement member 11 halfway through the relative rotation.

Thus, the second engagement body 20 is formed to include a third space S3 provided between the third opposing wall part 22 and the fourth opposing wall part 23 to allow rotation of the first engagement member 11 relative to the second engagement body 20, which is pivoted about the relative rotational axis P until the engagement between the first engagement member 11 and the second engagement member 21 is completed (FIGS. 9, 10, 12, and 14). The third space S3 is formed to prevent the first engagement member 11 contacting from the second engagement body 20 until the engagement between the first engagement member 11 and the second engagement member 21 is completed. Alternatively, the third space S3 may be formed to allow, when the first engagement member 11 contacts the second engagement body 20, the rotation of the first engagement member 11 relative to the second engagement body 20 to continue until the engagement between the first engagement member 11 and the second engagement member 21 is completed. In this case, for example, the rotation of the first engagement member 11 relative to the second engagement body 20 may be allowed to continue by bending both or one of the first engagement member 11 and the second engagement body 20 when contact is made therebetween.

For example, in the second engagement body 20, with reference to the position of the second engagement member 21 relative to the other of the two assembly members 110 and 120, the interval from the third opposing wall part 22 to the second engagement member 21 in the direction in which the third and the fourth opposing wall parts 22 and 23 are disposed opposite to each other may be increased to form the third space S3.

The following describes the lock structure 1 according to the present embodiment in detail with reference to one specific example of the first engagement body 10 and the second engagement body 20.

Figure 8:
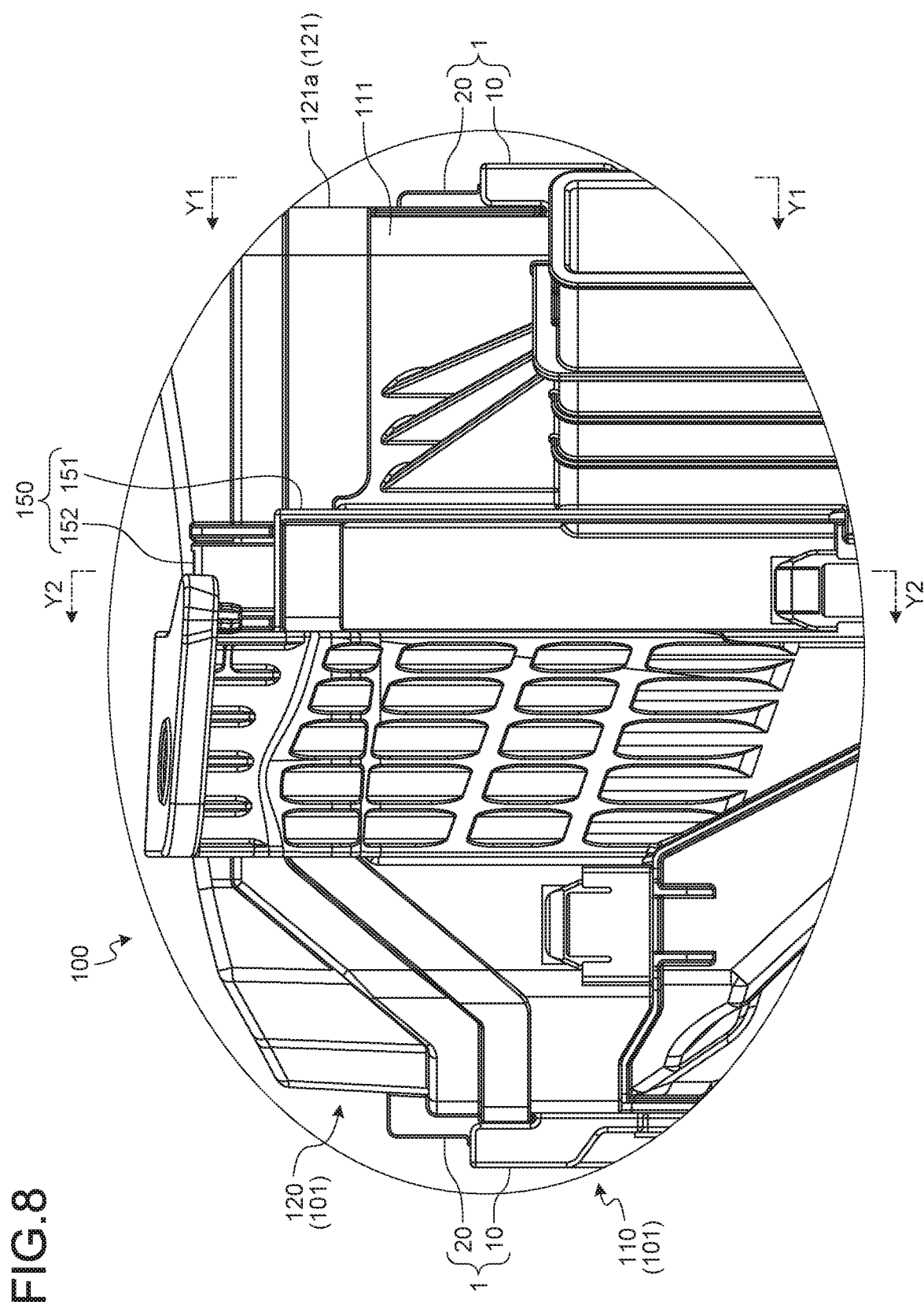
FIG. 8 is a side view illustrating the lock structure in the engagement-completed state when viewed from a lock structure side at a relative rotational axis.
Figure 9:
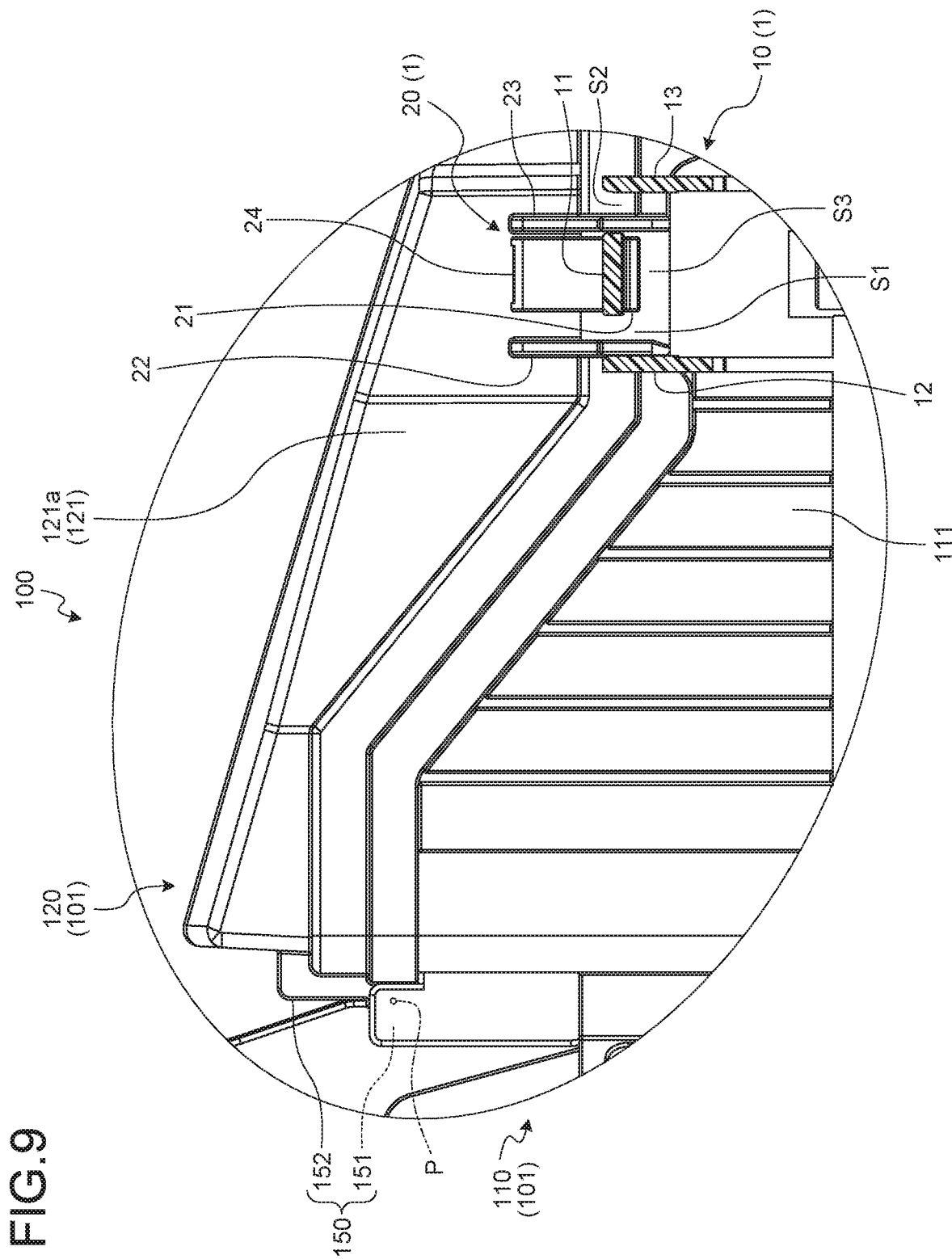
FIG. 9 is a cross-sectional view taken along line Y1-Y1 in FIG. 8.
Figure 10:
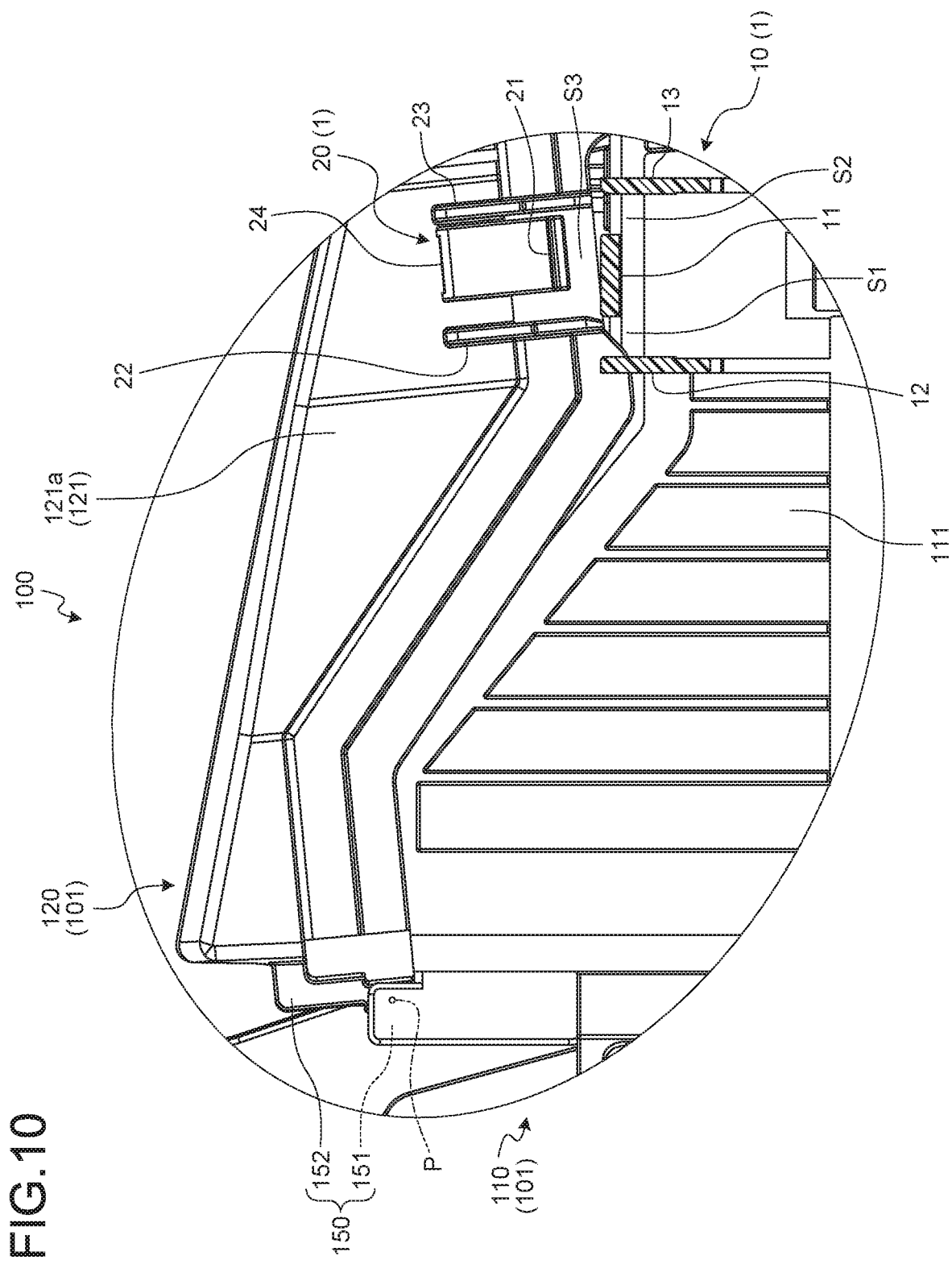
FIG. 10 is a cross-sectional view for describing the lock structure in the engagement operation.

In this example, the two assembly members 110 and 120 are made of an insulating material such as synthesis resin, and the first engagement body 10 and the second engagement body 20 are also made of an insulating material such as synthesis resin. Thus, in this example, the first engagement body 10 may be integrally shaped with one of the two assembly members 110 and 120, and the second engagement body 20 may be integrally shaped with the other assembly member. The two assembly members 110 and 120 in this example include the lock structures 1 at two places (FIGS. 1, 2, and 8).

Figure 2:
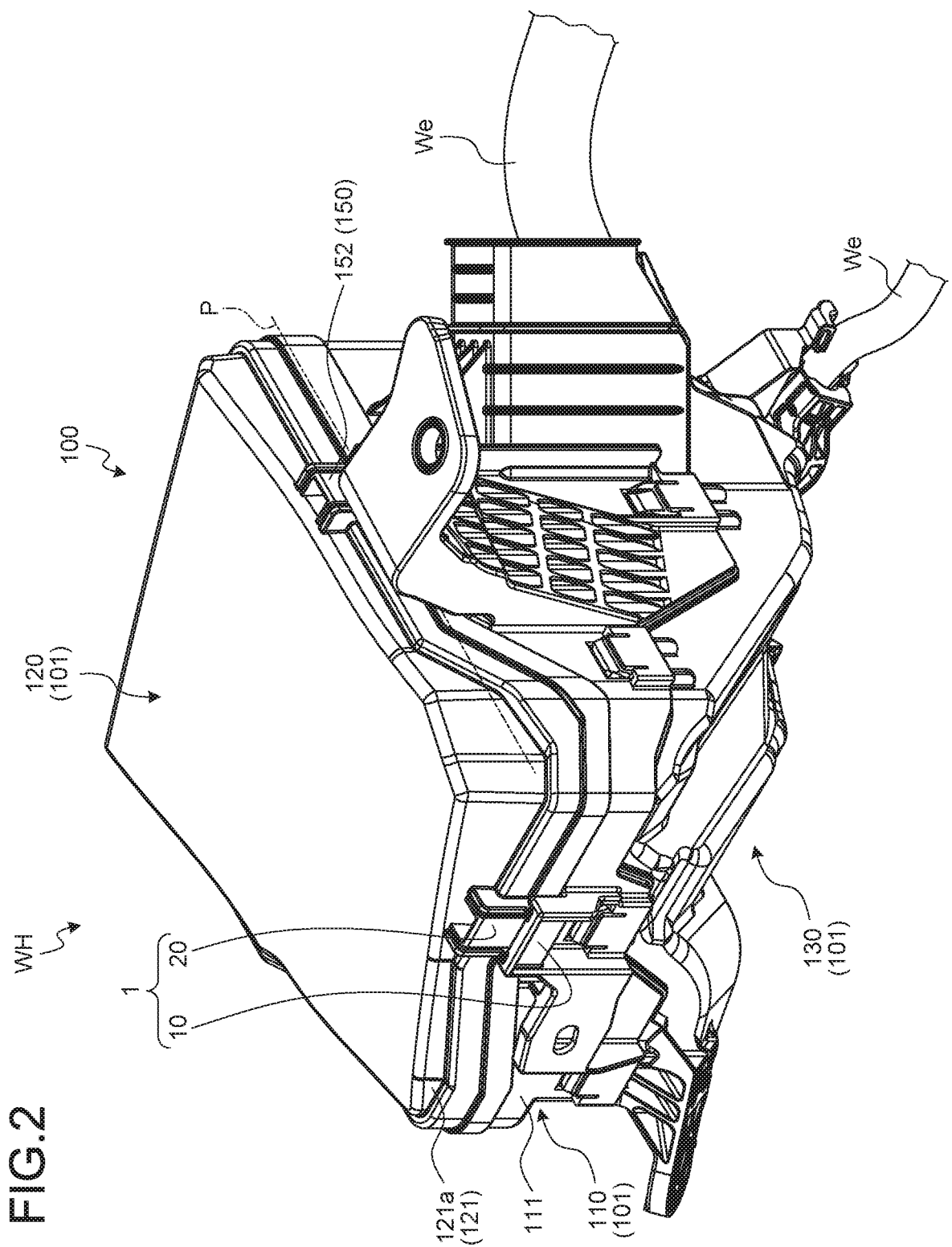
FIG. 2 is a perspective view of the lock structure, the electrical connection box, and the wire harness according to the embodiment when viewed from a different angle.

In this example, the two assembly members 110 and 120 are components of a housing 101 of the electrical connection box 100 (FIGS. 1 to 3). The housing 101 is a housing box formed by assembling a plurality of housing members with each other, and houses, for example, an electronic component EP inside (FIG. 3). The housing 101 also houses inside an electric wire We electrically connected with the electronic component EP, the electric wire We being extended from inside to outside (FIGS. 1 and 2). The electrical connection box 100 forms a wire harness WH together with the electronic component EP and the electric wire We. The electronic component EP is, for example, a circuit protection component such as a relay or a fuse, a connector, or a terminal clasp. In the present embodiment, an electronic device such as a circuit board or an electronic control unit (ECU) is another form of the electronic component EP.

In the housing 101 of this example, the one assembly member 110 is a first housing member, and the other assembly member 120 is a second housing member. Thus, in this example, the one assembly member 110 is referred to as "the first housing member 110", and the other assembly member 120 is referred to as "the second housing member 120". The first housing member 110 is a tubular member opened at both ends, and what is called a frame (FIG. 3). The second housing member 120 is a lid member that blocks one opening of the first housing member 110, and what is called an upper cover (FIG. 3). The second housing member 120 is a tubular member blocked at one end and opened at the other end, and includes a tubular peripheral wall part 121. Assembly of the first housing member 110 and the second housing member 120 is completed when the openings thereof are engaged with each other. The other opening of the first housing member 110 is covered by a third housing member 130, serving as what is called a lower cover (FIG. 3).

In the housing 101, the first engagement body 10 is disposed on an outer wall surface 111 of the first housing member 110 on the one opening side, and the second engagement body 20 is disposed on an outer wall surface 121a of the peripheral wall part 121 of the second housing member 120 on the opening side (FIGS. 1 to 5, 7, 9, and 10).

Figure 13:
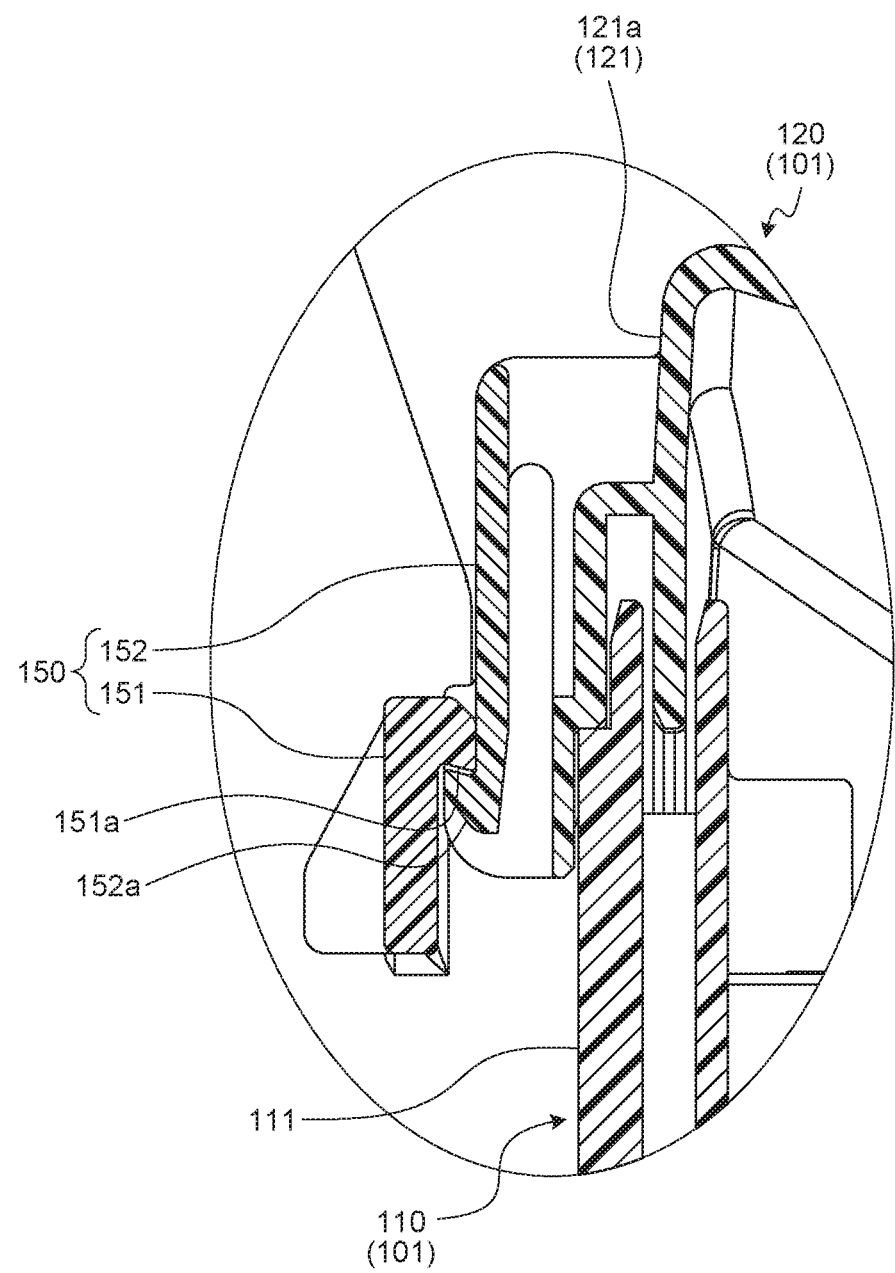
FIG. 13 is a cross-sectional view taken along line Y2-Y2 in FIG. 8.

The housing 101 of this example includes, in addition to the lock structures 1 at two places between the first housing member 110 and the second housing member 120, a lock structure 150 having a structure different from those of the lock structures 1 (FIGS. 1 to 10). The lock structure 150 is disposed on the relative rotational axis P side between the first housing member 110 and the second housing member 120. The lock structure 150 includes a first engagement body 151 provided to the first housing member 110, and a second engagement body 152 provided to the second housing member 120. The lock structure 150 holds assembly of the first housing member 110 and the second housing member 120 through engagement between a first engagement member 151a of the first engagement body 151 and a second engagement member 152a of the second engagement body 152 when the assembly of the first housing member 110 and the second housing member 120 is completed (FIG. 13). In the housing 101, the first engagement body 151 is disposed on the outer wall surface 111 of the first housing member 110 on the one opening side and the relative rotational axis P side, and the second engagement body 152 is disposed on the outer wall surface 121a of the peripheral wall part 121 of the second housing member 120 on the opening side and the relative rotational axis P side.

The lock structure 150 is disposed, for example, higher than the lock structure 1 in the up-down direction of a vehicle. Thus, when assembling the first housing member 110 and the second housing member 120, a worker potentially starts engagement between the first engagement body 151 and the second engagement body 152 of the lock structure 150 earlier than engagement between the first engagement body 10 and the second engagement body 20 of the lock structure 1. Thus, the worker potentially performs relative rotation of the first housing member 110 and the second housing member 120, which is pivoted about the lock structure 150 at the assembly of the first housing member 110 and the second housing member 120.

A contact point between the first engagement body 151 and the second engagement body 152 of the first housing member 110 and the second housing member 120 of this example is rotated relative to the relative rotational axis P. The contact point between the first engagement body 151 and the second engagement body 152 gradually displace with the progress of the relative rotation of the first housing member 110 and the second housing member 120 until the engagement between the first engagement member 151a and the second engagement member 152a is completed after the first engagement body 151 and the second engagement body 152 first contact each other. Accordingly, the axis position of the relative rotational axis P displaces between the first housing member 110 and the second housing member 120 in accordance with the relative positions of the first housing member 110 and the second housing member 120.

In each lock structure 1 of this example, the first engagement member 11 and the second engagement member 21 are formed as claw members.

In the first engagement body 10 of this example, the first and the second opposing wall parts 12 and 13 have plate shapes, and the first engagement member 11 is disposed at an interval from the first and the second opposing wall parts 12 and 13. The first and the second opposing wall parts 12 and 13 protrude in the same direction from the outer wall surface 111 of the first housing member 110.

Figure 11:
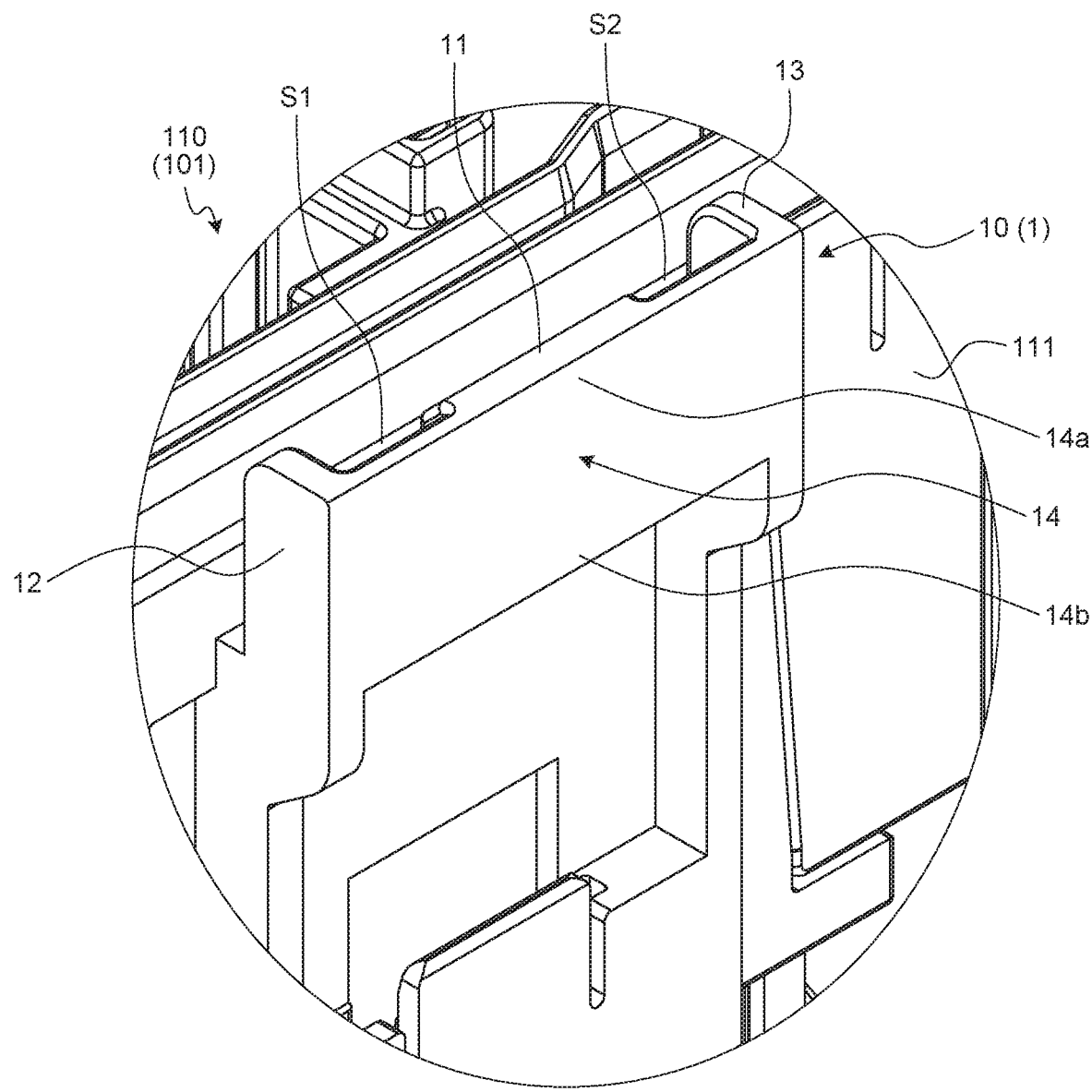
FIG. 11 is a perspective view of a first engagement body.
Figure 14:
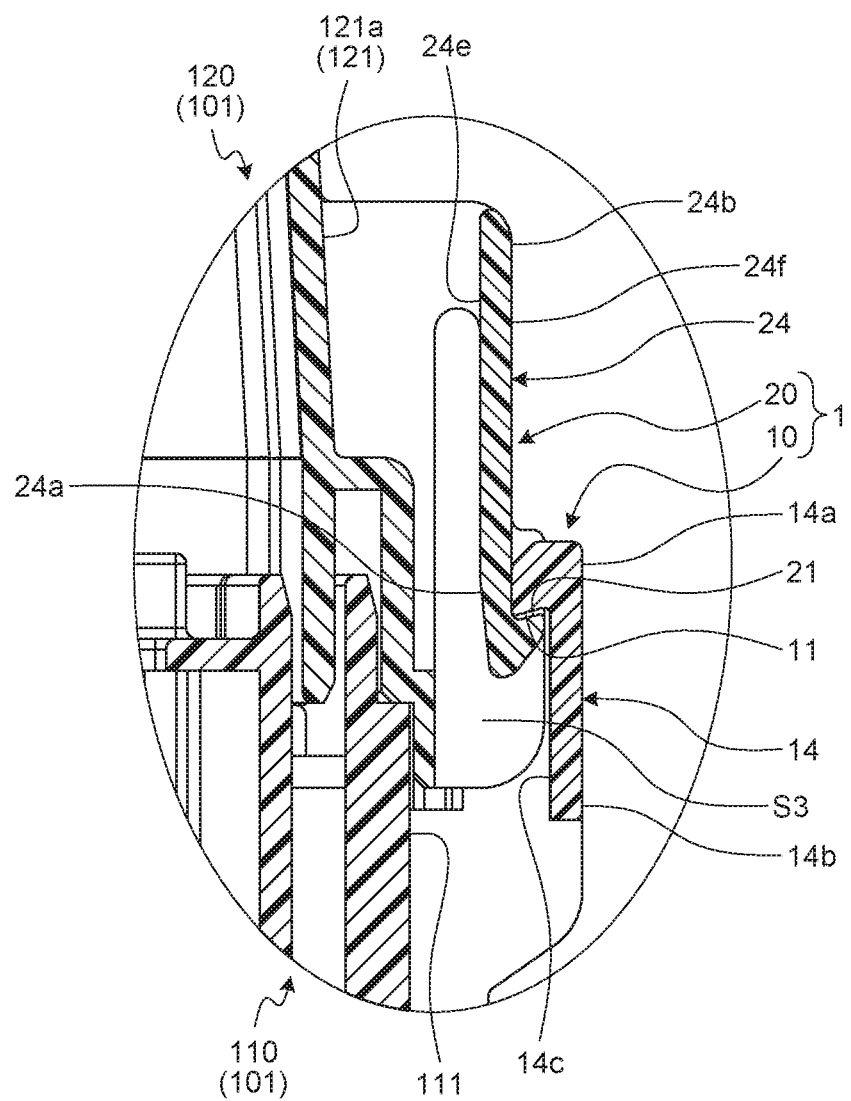
FIG. 14 is a cross-sectional view taken along line X-X in FIG. 5.

The first engagement body 10 of this example includes a rectangular piece 14 disposed between the first and the second opposing wall parts 12 and 13 (FIGS. 3 to 7, 11, and 14). One end of the piece 14 in the direction in which the first and the second opposing wall parts 12 and 13 are disposed opposite to each other is coupled with the first opposing wall part 12, and the other end thereof is coupled with the second opposing wall part 13. The piece 14 includes first and second peripheral parts 14a and 14b extending in the direction in which the first and the second opposing wall parts 12 and 13 are disposed opposite to each other (FIGS. 11 and 14).

When the first housing member 110 and the second housing member 120 are assembled, the first engagement body 10 is moved closer to the second engagement body 20 from the first peripheral part 14a side. In the first engagement body 10, the first engagement member 11 is provided to the first peripheral part 14a. The first engagement body 10 is provided with a gap between one plane 14c of the piece 14 and the outer wall surface 111 of the first housing member 110, into which the second engagement body 20 is allowed to enter (FIG. 14). Thus, the first engagement member 11 is formed in a claw shape protruding from the one plane 14c of the first peripheral part 14a of the piece 14 and extending along the first peripheral part 14a (FIGS. 11 and 14).

In the first engagement body 10, the space between the first engagement member 11 and the first opposing wall part 12 is an entrance through which the third opposing wall part 22 enters into the first space S1. The first space S1 of this example not only includes the space between the first engagement member 11 and the first opposing wall part 12 but also extends from the space between the first engagement member 11 and the first opposing wall part 12 to the second peripheral part 14b along the first opposing wall part 12. For example, the first space S1 is formed by setting, first at designing, the first engagement member 11 and the position of the second engagement member 21 being engaged with each other in the space between the first housing member 110 and the second housing member 120, and then setting, with reference to the position of the first engagement member 11 relative to the first housing member 110, the interval from the first opposing wall part 12 to the first engagement member 11 in the direction in which the first and the second opposing wall parts 12 and 13 are disposed opposite to each other. In other words, the first space S1 is formed by separating the first opposing wall part 12 from the first engagement member 11 so that the space allows the rotation of the third opposing wall part 22 relative to the first engagement body 10.

In the first engagement body 10, the space between the first engagement member 11 and the second opposing wall part 13 is an entrance through which the fourth opposing wall part 23 enters into the second space S2. The second space S2 of this example not only includes the space between the first engagement member 11 and the second opposing wall part 13 but also extends from the space between the first engagement member 11 and the second opposing wall part 13 to the second peripheral part 14b along the second opposing wall part 13. For example, the second space S2 is formed by setting, with reference to the position of the first engagement member 11 relative to the first housing member 110, which is set as described above, the interval from the second opposing wall part 13 to the first engagement member 11 in the direction in which the first and the second opposing wall parts 12 and 13 are disposed opposite to each other. In other words, the second space S2 is formed by separating the second opposing wall part 13 from the first engagement member 11 so that the space allows the rotation of the fourth opposing wall part 23 relative to the first engagement body 10.

In the second engagement body 20 of this example, the third and the fourth opposing wall parts 22 and 23 have plate shapes, and the second engagement member 21 is disposed at an interval from the third and the fourth opposing wall parts 22 and 23. The third and the fourth opposing wall parts 22 and 23 protrude in the same direction from the outer wall surface 121a of the peripheral wall part 121.

Figure 12:
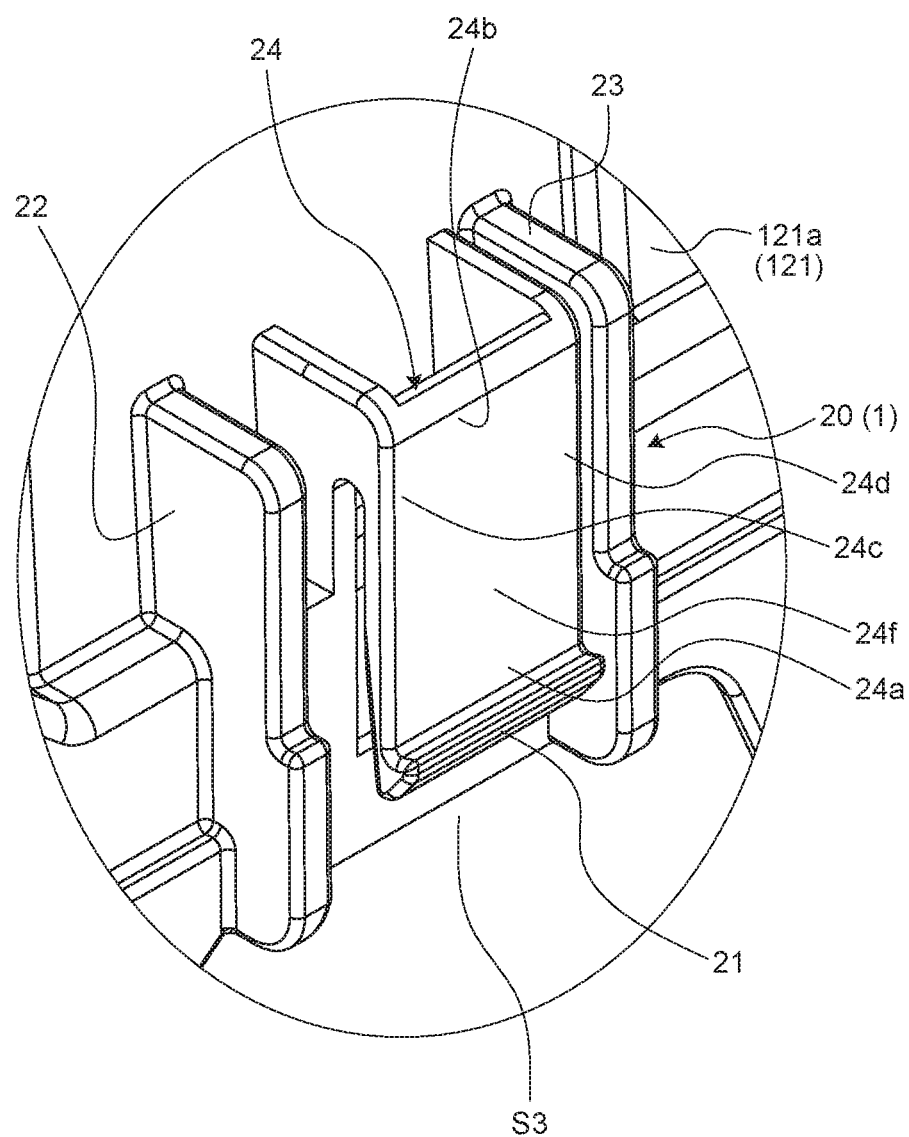
FIG. 12 is a perspective view of a second engagement body.

The second engagement body 20 of this example includes a flexible rectangular piece 24 disposed between the third and the fourth opposing wall parts 22 and 23 (FIGS. 3 to 7, 9, 10, 12, and 14). The piece 24 includes first and second peripheral parts 24a and 24b extending along the direction in which the third and the fourth opposing wall parts 22 and 23 are disposed opposite to each other, and third and fourth peripheral parts 24c and 24d extending in the direction in which the third and the fourth opposing wall parts 22 and 23 extend (FIG. 12).

When the first housing member 110 and the second housing member 120 are assembled with each other, the second engagement body 20 is moved closer to the first engagement body 10 from the first peripheral part 24a side. In the second engagement body 20, the piece 24 is formed in a cantilever shape having a free end on the first peripheral part 24a side and a fixed end on the second peripheral part 24b side, and the second engagement member 21 is provided to the first peripheral part 24a. In the second engagement body 20, the second peripheral part 24b side of the piece 24 is fixed to the outer wall surface 121a of the peripheral wall part 121, and a gap is provided between one plane 24e of the piece 24 and the outer wall surface 121a of the peripheral wall part 121 (FIG. 14). As described above, the second engagement body 20 enters the gap between the one plane 14c of the piece 14 of the first engagement body 10 and the outer wall surface 111 of the first housing member 110. Thus, the second engagement member 21 is formed in a claw shape protruding from another plane 24f of the first peripheral part 24a of the piece 24 and extending along the first peripheral part 24a (FIGS. 12 and 14).

In the second engagement body 20, the third opposing wall part 22 and the fourth opposing wall part 23 protrude further than the first peripheral part 24a and the second engagement member 21 in the direction in which the third opposing wall part 22 and the fourth opposing wall part 23 extend. In the second engagement body 20, the third space S3 is a space between the protrusions of the third opposing wall part 22 and the fourth opposing wall part 23. For example, the third space S3 is formed by setting, first at designing, the first engagement member 11 and the position of the second engagement member 21 being engaged with each other in the space between the first housing member 110 and the second housing member 120, and then setting, with reference to the position of the second engagement member 21 relative to the second housing member 120, the interval from the third opposing wall part 22 to the second engagement member 21 and the third peripheral part 24c of the piece 24 in the direction in which the third and the fourth opposing wall parts 22 and 23 are disposed opposite to each other. In other words, the third space S3 is formed by separating the third opposing wall part 22 from the second engagement member 21 and the third peripheral part 24c of the piece 24 so that the space allows the rotation of the first engagement member 11 relative to the second engagement body 20.

In the lock structure 1, the first engagement body 10 and the second engagement body 20 perform relative rotation pivoted about the relative rotational axis P simultaneously with the relative rotation operation between the first housing member 110 and the second housing member 120, which is pivoted about the relative rotational axis P. Specifically, in the lock structure 1, along with the relative rotation of the first engagement body 10 and the second engagement body 20, the third opposing wall part 22 enters into the first space S1 while performing relative rotation pivoted about the relative rotational axis P, the fourth opposing wall part 23 enters into the second space S2 while performing relative rotation pivoted about the relative rotational axis P, and the first engagement member 11 enters into the third space S3 while performing relative rotation pivoted about the relative rotational axis P. Then, in the lock structure 1, until the engagement between the first engagement member 11 and the second engagement member 21 is completed, the third opposing wall part 22 performs the relative rotation in the first space S1, the fourth opposing wall part 23 performs the relative rotation in the second space S2, and the first engagement member 11 performs the relative rotation in the third space S3. Thus, in the lock structure 1, the first engagement body 10 and the second engagement body 20 are not engaged with each other halfway through the relative rotation pivoted about the relative rotational axis P, and the relative rotation of the first engagement body 10 and the second engagement body 20 can be continued until the first engagement member 11 and the second engagement member 21 are engaged with each other. Thus, the lock structure 1 can operate simultaneously with the relative rotation operation between the first housing member 110 and the second housing member 120, which is pivoted about the relative rotational axis P so that the engagement between the first engagement member 11 and the second engagement member 21 is completed.

Figure 15:
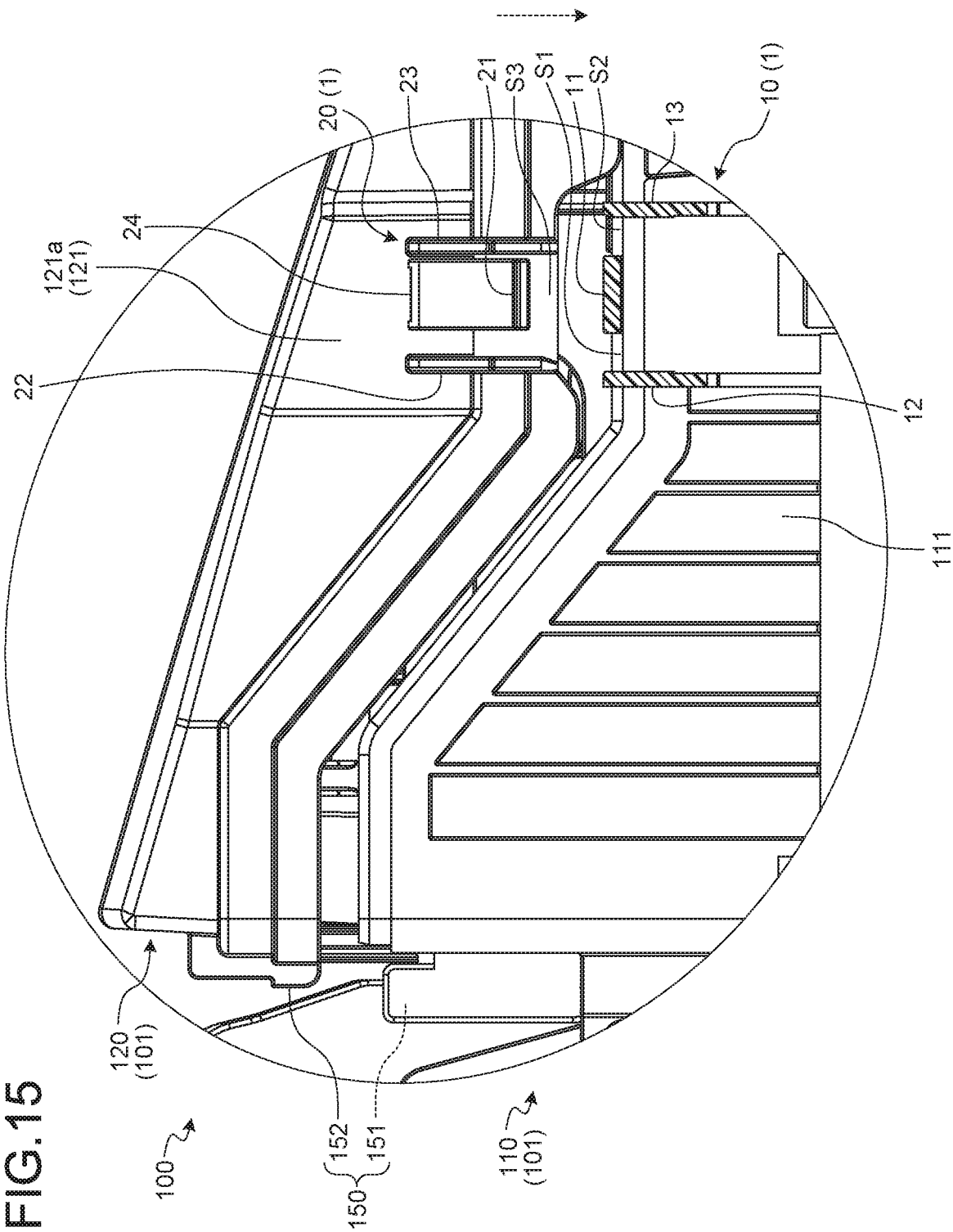
FIG. 15 is a cross-sectional view for describing a modification of assembly.

The first housing member 110 and the second housing member 120 of this example may be relatively moved in a linear relative moving direction and assembled with each other while the openings thereof are moved closer to each other (FIG. 15). When the first housing member 110 and the second housing member 120 are assembled with each other through such a linear assembly operation, the first engagement member 11 and the second engagement member 21 need to be engaged with each other while the first engagement body 10 and the second engagement body 20 are linearly relatively moved along the assembly operation in the lock structure 1.

Thus, in the first engagement body 10 of this example, the first engagement member 11 extends in a direction orthogonal to the linear relative moving direction of the first housing member 110 and the second housing member 120, and the first and the second opposing wall parts 12 and 13 extend in the relative moving direction. In the second engagement body 20 of this example, the second engagement member 21 extends in the direction orthogonal to the relative moving direction, and the third and the fourth opposing wall parts 22 and 23 extend in the relative moving direction. In the lock structure 1, the pair of the first opposing wall part 12 and the third opposing wall part 22 or the pair of the second opposing wall part 13 and the fourth opposing wall part 23 may be used as guide wall parts when the first housing member 110 and the second housing member 120 are assembled with each other in the linear relative moving direction.

When the first housing member 110 and the second housing member 120 can be assembled in the linear relative moving direction, the lock structure 1 can operate simultaneously with the linear assembly operation so that engagement between the first engagement member 11 of the first engagement body 10 and the second engagement member 21 of the second engagement body 20 is completed. When the linear assembly operation of the first housing member 110 and the second housing member 120 is difficult due to, for example, interference with a peripheral component covering the blocked part of the second housing member 120, the lock structure 1 can perform relative rotation of the first housing member 110 and the second housing member 120, which is pivoted about the relative rotational axis P so that engagement between the first engagement member 11 of the first engagement body 10 and the second engagement member 21 of the second engagement body 20 is completed.

As described above, the lock structure 1 according to the present embodiment can operate simultaneously with the assembly operation of the two assembly members 110 and 120 so that engagement between the first engagement member 11 of the first engagement body 10 and the second engagement member 21 of the second engagement body 20 is completed. The engagement between the first engagement member 11 and the second engagement member 21 can be completed in any of the case in which the two assembly members 110 and 120 are assembled with each other through the relative rotation operation pivoted about the relative rotational axis P and the case in which the two assembly members 110 and 120 are assembled with each other through the linear assembly operation. Thus, the lock structure 1 can improve the assembly operability of the first housing member 110 and the second housing member 120. The lock structure 1 is one component of the electrical connection box 100 and the wire harness WH. Thus, the electrical connection box 100 and the wire harness WH according to the present embodiment can obtain effects achieved by the lock structure 1.

In a lock structure according to the present embodiment, until engagement between a first engagement member and a second engagement member is completed, a third opposing wall part performs relative rotation in a first space and a fourth opposing wall part performs relative rotation in a second space. Thus, in the lock structure, the first engagement body and the second engagement body are not engaged halfway through relative rotation pivoted about a relative rotational axis, and the relative rotation between the first engagement body and the second engagement body can be continued until the first engagement member and the second engagement member are engaged. Thus, the lock structure according to the present embodiment can operate simultaneously with relative rotation operation of two assembly members pivoted about the relative rotational axis so that engagement between the first engagement member and the second engagement member is completed. In addition, an electrical connection box and a wire harness according to the present embodiment includes the lock structure, and thus can obtain effects achieved by the lock structure.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A lock structure comprising:
a first engagement body that includes a first engagement member and first and second opposing wall parts extending in a same direction and disposed opposite to each other with the first engagement member interposed between the first and the second opposing wall parts and is disposed, in one of two assembly members to be assembled with each other through a relative rotation operation pivoted about a relative rotational axis, at a position separated from the relative rotational axis in a direction orthogonal to an axis line direction of the relative rotational axis so that a direction orthogonal to a direction in which the first and the second opposing wall parts are disposed opposite to each other and a direction in which the first and the second opposing wall parts extend is aligned with the axis line direction of the relative rotational axis; and
a second engagement body that includes a second engagement member engaged with the first engagement member when the assembly of the two assembly members is completed and third and fourth opposing wall parts extending in a same direction and disposed opposite to each other with the second engagement member interposed between the third and the fourth opposing wall parts and is disposed, in the other of the two assembly members, at a position separated from the relative rotational axis in the direction orthogonal to the axis line direction of the relative rotational axis so that a direction orthogonal to a direction in which the third and the fourth opposing wall parts are disposed opposite to each other and a direction in which the third and the fourth opposing wall parts extend is aligned with the axis line direction of the relative rotational axis, wherein
the first engagement body includes a first space and a second space, the first space being provided between the first engagement member and the first opposing wall part on the relative rotational axis side to allow rotation of the third opposing wall part on the relative rotational axis side relative to the first engagement body, which is pivoted about the relative rotational axis until engagement between the first and the second engagement members is completed, the second space being provided between the first engagement member and the second opposing wall part to allow rotation of the fourth opposing wall part relative to the first engagement body, which is pivoted about the relative rotational axis until engagement between the first and the second engagement members is completed, and
the second engagement body further includes a body that includes the second engagement member, the body between the third opposing wall part and the fourth opposing wall part and separated from each of the third opposing wall part and the fourth opposing wall part by a respective gap.

2. The lock structure according to claim 1, wherein
the first engagement body includes a first interval from the first opposing wall part to the first engagement member in the direction in which the first and the second opposing wall parts are disposed opposite to each other, and a second interval from the second opposing wall part to the first engagement member in the direction in which the first and the second opposing wall parts are disposed opposite to each other, the first interval defining the first space and the second interval defining the second space, and
the third and fourth opposing wall parts are configured to, while pivoting about the relative rotational axis before the engagement between the first and the second engagement members is completed, cause the first engagement body to bend by contacting the first engagement body such that the first interval and the second interval increases to allow the rotation of the third and fourth opposing wall parts relative to the first engagement body to continue.

3. The lock structure according to claim 2, wherein
the first and the second engagement members are formed in claw shapes engageable with each other, and
the second engagement body includes a third space provided between the third and the fourth opposing wall parts to allow rotation of the first engagement member relative to the second engagement body, which is pivoted about the relative rotational axis until engagement between the first and the second engagement members is completed.

4. The lock structure according to claim 3, wherein
the second engagement body includes a third interval from the third opposing wall part to the second engagement member in the direction in which the third and the fourth opposing wall parts are disposed opposite to each other, the third interval defining a portion of the third space, and
the first engagement member is configured to, during the relative rotation operation before the engagement between the first and the second engagement members is completed, bend the second engagement body by contacting the second engagement body such that the third interval increases to allow the rotation of the first engagement member relative to the second engagement body.

5. The lock structure according to claim 1, wherein
the first and the second engagement members are formed in claw shapes engageable with each other, and
the second engagement body includes a third space provided between the third and the fourth opposing wall parts to allow rotation of the first engagement member relative to the second engagement body, which is pivoted about the relative rotational axis until engagement between the first and the second engagement members is completed.

6. The lock structure according to claim 5, wherein
the second engagement body includes a third interval from the third opposing wall part to the second engagement member in the direction in which the third and the fourth opposing wall parts are disposed opposite to each other, the third interval defining a portion of the third space, and
the first engagement body is configured to, during the relative rotation operation before the engagement between the first and the second engagement members is completed, cause the second engagement body to bend by contacting the second engagement body such that the third interval increases to allow the rotation of the first engagement member relative to the second engagement body.

7. The lock structure according to claim 1, wherein the body is configured as a cantilever.

8. The lock structure according to claim 1, wherein the first engagement body further includes a body that includes the first engagement member, the body of the first engagement body between and connected to the first opposing wall part and the second opposing wall part.

9. The lock structure according to claim 1, wherein the first engagement member is on an inner face of the body of the first engagement body.

10. An electrical connection box comprising:
a housing that houses an electronic component inside, wherein
the housing includes two assembly members to be assembled with each other through a relative rotation operation pivoted about a relative rotational axis, and a lock structure holding the two assembly members being assembled with each other,
the lock structure includes
a first engagement body that includes a first engagement member and first and second opposing wall parts extending in a same direction and disposed opposite to each other with the first engagement member interposed between the first and the second opposing wall parts and is disposed, in one of the two assembly members, at a position separated from the relative rotational axis in a direction orthogonal to an axis line direction of the relative rotational axis so that a direction orthogonal to a direction in which the first and the second opposing wall parts are disposed opposite to each other and a direction in which the first and the second opposing wall parts extend is aligned with the axis line direction of the relative rotational axis, and
a second engagement body that includes a second engagement member engaged with the first engagement member when the assembly of the two assembly members is completed and third and fourth opposing wall parts extending in a same direction and disposed opposite to each other with the second engagement member interposed between the third and the fourth opposing wall parts and that is disposed, in the other of the two assembly members, at a position separated from the relative rotational axis in the direction orthogonal to the axis line direction of the relative rotational axis so that a direction orthogonal to a direction in which the third and the fourth opposing wall parts are disposed opposite to each other and a direction in which the third and the fourth opposing wall parts extend is aligned with the axis line direction of the relative rotational axis,
the first engagement body includes a first space and a second space, the first space being provided between the first opposing wall part on the relative rotational axis side and the first engagement member to allow rotation of the third opposing wall part on the relative rotational axis side relative to the first engagement body, which is pivoted about the relative rotational axis until engagement between the first and the second engagement members is completed, the second space being provided between the second opposing wall part and the first engagement member to allow rotation of the fourth opposing wall part relative to the first engagement body, which is pivoted about the relative rotational axis until engagement between the first and the second engagement members is completed, and the second engagement body further includes a body that includes the second engagement member, the body between the third opposing wall part and the fourth opposing wall part and separated from each of the third opposing wall part and the fourth opposing wall part by a respective gap.

11. A wire harness comprising:

an electronic component;

an electric wire electrically connected with the electronic component; and a housing that houses inside the electronic component and the electric wire, the electric wire being extended from inside to outside, wherein the housing includes two assembly members to be assembled with each other through a relative rotation operation pivoted about a relative rotational axis, and a lock structure holding the two assembly members being assembled with each other, the lock structure includes a first engagement body that includes a first engagement member and first and second opposing wall parts extending in a same direction and disposed opposite to each other with the first engagement member interposed the first and the second opposing wall parts and is disposed, in one of the two assembly members, at a position separated from the relative rotational axis in a direction orthogonal to an axis line direction of the relative rotational axis so that a direction orthogonal to a direction in which the first and the second opposing wall parts are disposed opposite to each other and a direction in which the first and the second opposing wall parts extend is aligned with the axis line direction of the relative rotational axis, and a second engagement body that includes a second engagement member engaged with the first engagement member when the assembly of the two assembly members is completed and third and fourth opposing wall parts extending in a same direction and disposed opposite to each other with the second engagement member interposed the third and the fourth opposing wall parts and is disposed, in the other of the two assembly members, at a position separated from the relative rotational axis in the direction orthogonal to the axis line direction of the relative rotational axis so that a direction orthogonal to a direction in which the third and the fourth opposing wall parts are disposed opposite to each other and a direction in which the third and the fourth opposing wall parts extend is aligned with the axis line direction of the relative rotational axis, the first engagement body includes a first space and a second space, the first space being provided between the first opposing wall part on the relative rotational axis side and the first engagement member to allow rotation of the third opposing wall part on the relative rotational axis side relative to the first engagement body, which is pivoted about the relative rotational axis until engagement between the first and the second engagement members is completed, the second space being provided between the second opposing wall part and the first engagement member to allow rotation of the fourth opposing wall part relative to the first engagement body, which is pivoted about the relative rotational axis until engagement between the first and the second engagement members is completed, and the second engagement body further includes a body that includes the second engagement member, the body between the third opposing wall part and the fourth opposing wall part and separated from each of the third opposing wall part and the fourth opposing wall part by a respective gap.

* * * * *